(12) United States Patent  
McLeod

(10) Patent No.: US 6,309,516 B1
(45) Date of Patent: Oct. 30, 2001

(54) METHOD AND APPARATUS FOR METAL ALLOT SPUTTERING

(75) Inventor: Paul Stephen McLeod, Berkeley, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/495,469

(22) Filed: Feb. 1, 2000

Related U.S. Application Data

(60) Provisional application No. 60/133,213, filed on May 7, 1999.

(51) Int. Cl.$^7$ .................................................. C23C 14/34
(52) U.S. Cl. ............................. 204/192.2; 204/192.12; 204/192.16; 204/298.11; 204/298.12; 204/298.14; 204/298.23; 204/298.25; 204/298.26; 204/298.29
(58) Field of Search .......................... 204/192.12, 192.16, 204/192.2, 290.11, 298.12, 298.14, 298.19, 298.23, 298.25, 298.26, 298.29

(56) References Cited

U.S. PATENT DOCUMENTS

| | | | |
|---|---|---|---|
| 3,414,503 | 12/1968 | Brichard | 204/298.29 |
| 3,891,536 | 6/1975 | Glaser et al. | 204/298.29 |
| 3,985,635 | 10/1976 | Adam et al. | 606/32 |
| 4,022,947 | 5/1977 | Grubb et al. | 428/432 |
| 4,132,624 | 1/1979 | King et al. | 204/298.29 |
| 4,194,962 | 3/1980 | Chambers et al. | 204/298.23 |
| 4,415,427 | 11/1983 | Hidler et al. | 204/298.26 |
| 4,437,966 | 3/1984 | Hope et al. | 204/298.29 |
| 4,465,575 | 8/1984 | Love et al. | 204/192.26 |
| 4,634,512 | * 1/1987 | Allen et al. | 204/192.2 |
| 4,735,698 | * 4/1988 | Nomura et al. | 204/192.2 |
| 4,834,856 | 5/1989 | Wehner | 204/192.24 |
| 4,851,095 | * 7/1989 | Scobey et al. | 204/192.12 |
| 5,340,454 | * 8/1994 | Schaefer et al. | 204/192.12 |
| 5,658,439 | 8/1997 | Burkle et al. | 204/192.23 |
| 5,705,044 | 1/1998 | Washburn et al. | 204/298.25 |
| 5,891,311 | 4/1999 | Lewis et al. | 204/192.12 |
| 5,922,177 | 7/1999 | Iketani et al. | 204/192.15 |

* cited by examiner

Primary Examiner—Rodney G. McDonald
(74) Attorney, Agent, or Firm—McDermott, Will & Emery

(57) ABSTRACT

A method and apparatus for sputter deposition of metal alloys with improved compositional uniformity is provided, wherein a first, narrow width target is provided with a sputtering surface comprised of a metal alloy including metal elements having different angular distributions of sputtered atoms, and a wider width substrate having a deposition surface is moved past the sputtering surface, whereby the deposition surface traverses all arrival angles of the sputtered atoms thereby compensating for the different angular distributions of the sputtered atoms. The inventive methodology finds particular utility in the manufacture of magnetic and magneto-optical (MO) recording media.

20 Claims, 2 Drawing Sheets

METHOD AND APPARATUS FOR METAL ALLOT SPUTTERING

CROSS-REFERENCE TO PROVISIONAL APPLICATION

This application claims priority from U.S. provisional patent application Ser. No. 60/133,213 filed May 7, 1999, the entire disclosure of which is incorporated herein by reference.

FIELD OF THE INVENTION

The present invention relates to a method and apparatus for sputtering metal alloys onto substrate deposition surfaces, wherein non-uniformity of the deposited alloy compositions arising from differences in angular distributions of the sputtered atoms of the component metal elements of the alloy is substantially eliminated. The invention has particular utility in the manufacture of magnetic and magneto-optical (MO) recording media.

BACKGROUND OF THE INVENTION

Magnetic and MO media are widely employed in various applications, particularly in the computer industry for data/information storage and retrieval purposes. A magnetic medium in e.g., disk form, such as utilized in computer-related applications, comprises a non-magnetic substrate, e.g., of glass, ceramic, glass-ceramic composite, polymer, metal, or metal alloy, typically an aluminum (Al)-based alloy such as aluminum-magnesium (Al—Mg), having at least one major surface on which a layer stack comprising a plurality of thin film layers constituting the medium are sequentially deposited. Such layers may include, in sequence from the substrate (deposition) surface, a plating layer, e.g., of amorphous nickel-phosphorus (Ni—P), a polycrystalline underlayer, typically of chromium (Cr) or a Cr-based alloy such as chromium-vanadium (Cr—V), a magnetic layer, e.g., of a cobalt (Co)-based alloy, and a protective overcoat layer, typically of carbon (C) or carbon doped with a non-metal element, e.g., hydrogen (H), nitrogen (N), or fluorine (F). A similar situation exists with magnetooptical (MO) media, wherein a layer stack is formed which comprises a reflective layer, typically of a metal or metal alloy, one or more rare-earth thermo-magnetic (RE—TM) alloy layers, one or more dielectric layers, and a protective overcoat layer, for functioning as reflective, transparent, writing, writing assist, and read-out layers, etc.

According to conventional automated manufacturing methodology, a number of the layers constituting the layer stack are deposited by cathode sputtering, typically by means of multi-cathode and/or multi-chamber sputtering apparatus, wherein a separate cathode comprising a selected target material is positioned in a separate process chamber (which may be located in a larger chamber or form one of a plurality of interconnected process chambers) dedicated for deposition of each layer. According to such conventional technology, media substrates, e.g., disks, are serially transported, in linear or circular fashion depending upon the physical configuration of the apparatus, from one process chamber to another for sputter deposition of a selected layer thereon, the sputter deposition commencing only when the disk has fully entered the respective process chamber in its transit from a preceding process chamber and is at rest. Stated differently, sputter deposition commences and continues for a predetermined interval only when the substrates are not in motion, i.e., deposition occurs onto static substrates.

While such conventional processing, i.e., "static deposition" is satisfactory for sputter deposition utilizing a variety of target materials, e.g., single metal elements, a problem arises when relatively small-sized metal alloy targets composed of two or more metal elements having different atomic masses are utilized for deposition of alloy films or layers on relatively large-sized substrates, e.g., disks. More specifically, since the angular distributions of the metal atoms sputtered from metal alloy targets are dependent upon the atomic masses of the various constituent metal elements of the alloy (A. Weucher et al., *J. Vac. Sci. Technol.* A, Vol. 6, pp. 2316–2318 (1988); L. Zheng et al., *J. Vac. Sci. Technol.* A, Vol. 15, pp. 2431–2433 (1997); P. J. Rudeck et al., *J. Vac. Sci. Technol.* A, Vol. 7, pp. 2289–2293 (1989)), a substantial (i.e., non-trivial) variation of alloy composition across the deposition surface of a relatively large-sized substrate can occur when the differences in atomic masses of the several component metal elements of the alloy are large and the target is relatively small-sized. In practice, problems associated with non-uniformity of sputtered metal alloy films due to such differences in angular distributions of sputtered atoms become significant when certain metal alloys utilized as the magnetic recording layer in the manufacture of magnetic or MO recording media contain metal elements of very different atomic masses, e.g., cobaltchromium-platinum-tantalum (Co—Cr—Pt—Ta) quaternary alloys, wherein the respective atomic masses of the constituent elements are approximately 60, 52, 195, and 181, and sputtering occurs from relatively small targets onto relatively large and static substrates, e.g., large diameter disks, according to the conventional automated manufacturing processing and methodology, as described supra. More specifically, and with reference to the graphs of FIGS. 1 and 2, the variation in the amounts of Co, Cr, Ta, and Pt contained in sputtered CoCrTaPt magnetic films, when measured across the width of a disk surface from the inner diameter (ID) to the outer diameter (OD) thereof is sufficient to cause a large variation in coercivity and attendant loss in data storage capability.

Accordingly, there exists a need for improved means and methodology for depositing, as by sputtering techniques, metal alloy films and layers having high compositional uniformity across a substrate surface. More specifically, there exists a need for improved means and methodology for sputtering highly compositionally uniform magnetic and other metal alloy layers for use in the manufacture of single and/or dual-sided magnetic and/or magneto-optical (MO) data/information storage and retrieval media, e.g., in the form of disks, which means and methodology provide rapid, simple, and cost-effective formation of such media.

The present invention addresses and solves compositional and uniformity problems attendant upon sputtering of metal alloy targets composed of two or more metal elements of different atomic masses utilized, inter alia, in the manufacture of high recording density, thin film magnetic and/or MO recording media, while maintaining full compatibility with all aspects of conventional automated manufacturing technology. Further, the means and methodology provided by the present invention enjoy diverse utility in the manufacture of various devices and articles requiring metal alloy coating or film layers.

DISCLOSURE OF THE INVENTION

An advantage of the present invention is an improved method for sputter depositing metal alloy layers with high compositional uniformity.

Another advantage of the present invention is an improved method for depositing metal alloy layers utilized in the manufacture of magnetic and/or MO recording media.

A further advantage of the present invention is an improved apparatus for sputter depositing metal alloy layers with high compositional uniformity.

A still further advantage of the present invention is an improved apparatus for sputter depositing metal alloy layers utilized in the manufacture of magnetic and/or MO recording media.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by a method of sputter depositing a layer of substantially uniform composition metal alloy on a deposition surface of a substrate, which method comprises the sequential steps of:

(a) providing a first target including a planar sputtering surface having a first width and comprised of at least a first metal alloy including at least two metal component elements, each element providing different angular distributions of sputtered atoms;

(b) providing a substrate having a planar deposition surface for receiving the sputtered atoms for deposition thereon of a layer of said first metal alloy, the deposition surface including opposed first and second edges defining a second width which is greater that the first width of the sputtering surface; and (c) sputtering the first target while moving the deposition surface past the sputtering surface from the first edge thereof to the second edge thereof, and/or from the second edge thereof to the first edge thereof, to deposit the layer of first metal alloy thereon, whereby the deposition surface traverses all arrival angles of the sputtered atoms during its motion past the sputtering surface, thereby compensating for the different angular distributions of the sputtered atoms and substantially eliminating non-uniform deposition of the metal component elements of the first metal alloy layer.

According to embodiments of the present invention, the second width of the substrate deposition surface is at least twice that of the first width of the sputtering surface; and step (a) further comprises providing a vapor shield surrounding the periphery of the sputtering surface of the first target for blocking deposition of sputtered atoms having very low arrival angles at the substrate deposition surface.

According to further embodiments of the present invention, the first metal alloy comprising the sputtering surface of the first target is a magnetic or non-magnetic alloy utilized in the manufacture of magnetic and/or magneto-optical (MO) recording media; step (a) comprises providing a first target having an elongated sputtering surface, wherein the first width thereof corresponds to the narrow dimension of the elongated sputtering surface; step (b) comprises providing a disk-shaped substrate for a magnetic or MO recording medium having first and second opposed major deposition surfaces, wherein the second width thereof corresponds to an outer diameter of the disk-shaped substrate; and step (c) comprises depositing the layer of first metal alloy on the first major deposition surface.

According to still further embodiments of the present invention, step (a) further comprises providing another target substantially identical to the first target, such that the sputtering surface thereof faces the second major deposition surface; and step (c) comprises depositing a layer of the first metal alloy on the second major deposition surface.

According to yet further embodiments of the present invention, step (a) further comprises providing the first target within a process chamber immediately adjacent an entrance/exit aperture; step (b) further comprises inserting the substrate into the process chamber via the entrance/exit aperture; and step (c) comprises sputtering at least a first portion of the sputtering surface of the first target during the inserting of the substrate into the process chamber.

According to additional embodiments of the present invention, the method comprises the further steps of:

(d) terminating the moving of the substrate deposition surface past the sputtering surface of the first target after completion of step (c);

(e) sputtering a second target located within the process chamber and comprised of a second target material for static deposition of a layer of the second target material on the first metal alloy layer;

(f) removing the substrate from the process chamber via the entrance/exit aperture after completion of step (e); and (g) sputtering at least a second portion of the sputtering surface of the first target during the removing of the substrate from the process chamber.

According to further additional embodiments of the present invention, step (a) further comprises providing the first target having an elongated sputtering surface in the form of parallel, elongated, first and second planar magnetron target segments which together constitute the first width, wherein the sputtering surface of at least one of the first and second planar magnetron targets comprises a metal alloy; wherein a vapor shield is provided intermediate the first and second target segments to separate atoms sputtered from each target segment; and the first and second target segments are electrically isolated from each other and sputtering power is independently applied to each segment.

According to another aspect of the present invention, an apparatus for sputter deposition of a substantially uniform composition metal alloy film on a substrate deposition surface comprises:

(a) a process chamber defining an interior space and including a substrate entrance/exit aperture at one end thereof, (b) a first target means positioned within the interior space immediately adjacent the entrance/exit aperture, the first target means including a planar sputtering surface having a first width and comprised of at least a first metal alloy including at least two metal component elements, each of the metal component elements having different angular distributions of sputtered atoms; and (c) substrate mounting and moving means for inserting and withdrawing a substrate from the process chamber via the entrance/exit aperture, the mounting and moving means being adapted to provide a substrate having a planar deposition surface which moves past the sputtering surface for receiving sputtered atoms therefrom for deposition thereon of a layer of the first metal alloy, the substrate deposition surface including opposed first and second edges defining a second width which is substantially greater than the first width of the sputtering surface, whereby the substrate deposition surface during its motion past the sputtering surface traverses all arrival angles of the sputtered atoms of the metal component elements, thereby substantially eliminating non-uniform deposition of the metal component elements on the substrate deposition surface due to the different angular distributions of sputtered atoms.

According to embodiments of the invention, the first target means (b) further comprises a vapor shield surrounding the periphery of the sputtering surface thereof for blocking deposition of sputtered atoms having very low arrival angles at the substrate deposition surface; and the substrate mounting and moving means (c) is adapted to provide a substrate having a second width which is at least twice that of the first width of the sputtering surface of the first target means.

According to further embodiments of the invention, the first target means (b) comprises an elongated, planar, sputtering surface and the first width thereof corresponds to the narrow dimension of the elongated sputtering surface; and the substrate mounting and moving means (c) is adapted to provide a disk-shaped substrate having opposed first and second major deposition surfaces, the second width of the substrate deposition surfaces corresponding to an outer diameter of the substrate.

According to still further embodiments of the invention, the first target means (b) comprises: a planar sputtering surface including parallel, elongated, first and second planar magnetron target segments which together constitute the first width thereof, wherein the sputtering surface of at least one of the first and second planar magnetron target segments comprises a metal alloy; a vapor shield is provided intermediate the first and second target segments to separate atoms sputtered from each target segment; means for electrically isolating the first and second target segments from each other; and means for independently supplying sputtering power to each target segment.

According to yet further embodiments of the present invention, an additional target means substantially identical to the first target means (b) is provided for depositing a layer of first metal alloy on both of the first and second major deposition surfaces of the disk-shaped substrate; and at least one second target means comprised of a second target material is provided within the interior space of the process chamber for static deposition of at least one layer of the second target material over at least one of the first and second deposition surfaces.

According to still another aspect of the present invention, an apparatus for sputter deposition of a substantially uniform composition metal alloy layer on a planar deposition surface of a substrate comprises:

a first, relatively narrow target having a planar sputtering surface comprised of a metal alloy including at least two metal elements each having different angular distributions of sputtered atoms; and means for compensating for the different angular distributions of sputtered atoms to thereby form a substantially uniform composition metal alloy layer on the substrate deposition surface.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which like reference numerals are employed throughout to designate similar features, wherein.

DESCRIPTION OF THE INVENTION

The present invention is based upon recognition that the problem of non-uniform metal alloy film deposition across a substrate surface which occurs when such films are formed by cathode sputtering utilizing a target which is relatively small compared to the substrate and the substrate is static, such as is frequently encountered in the manufacture of magnetic and/or MO recording media, can be compensated for, and thus substantially eliminated, by utilizing a sputtering target of narrow width (relative to that of the substrate) and moving the substrate deposition surface past the target, whereby the deposition surface traverses all of the arrival angles of the various species of sputtered atoms. As a consequence, each areal portion of the deposition surface receives substantially identical fluxes of incident sputtered species, resulting in formation of essentially uniform composition metal alloy films across the entire width of the deposition surface.

Figure 1:
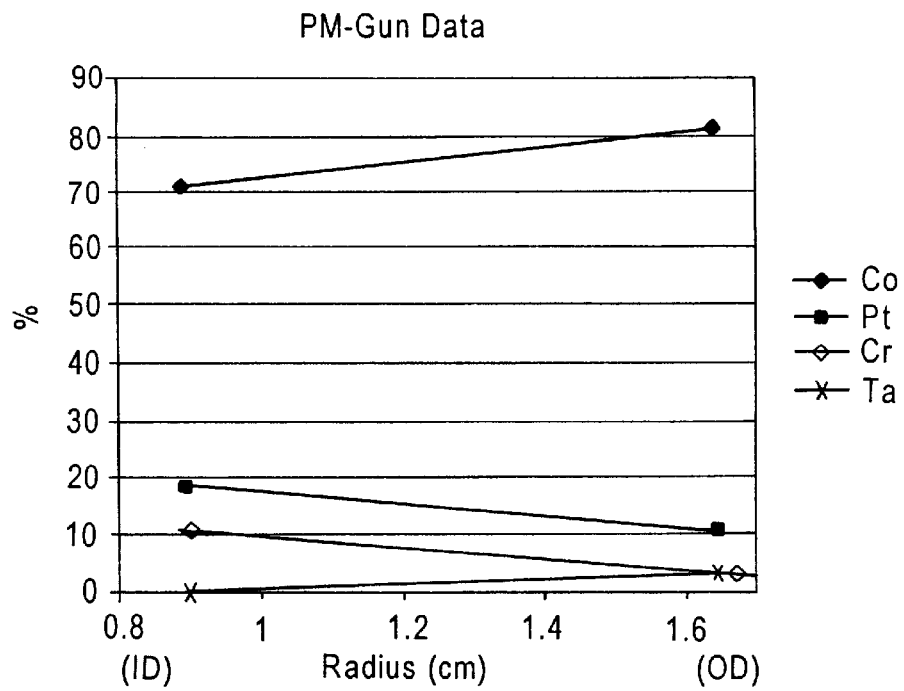
FIGS. 1 and 2 are graphs for illustrating the variation in the amounts of Co, Cr, Pt, and Ta contained in sputtered CoCrPtTa magnetic films across the width of disk substrates.
Figure 2:
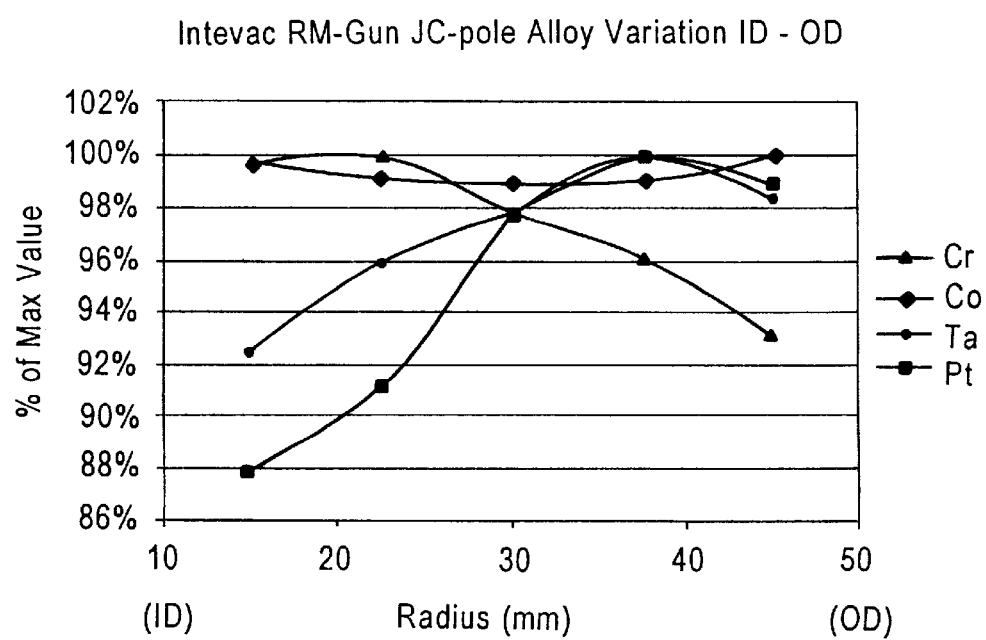
Figure 3:
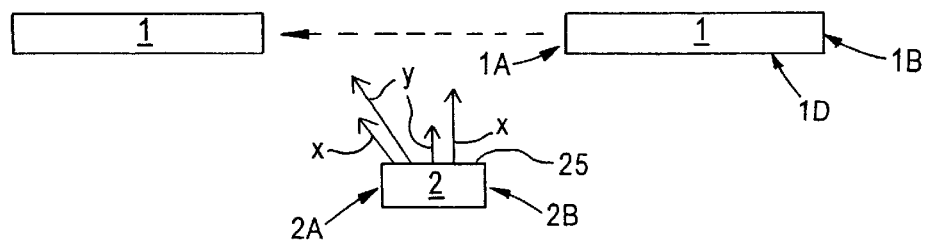
FIG. 3 is a simplified cross-sectional view illustrating the essential structural features and principles of the present invention.

Referring now to FIG. 3, shown therein is a schematic, cross-sectional view illustrating the essential features and operating principle of the present invention, wherein a relatively wide substrate 1 having a planar deposition surface 1D located between opposed first and second edges 1A and 1B, respectively, is shown during its path of motion past a relatively narrow target 2 having a planar sputtering surface 2S located between opposed first and second edges 2A and 2B, respectively, composed of a metal alloy. By way of illustration, but not limitation, assume that the metal alloy is composed of metal component elements X and Y having different angular distributions of sputtered atoms, wherein metal component element X has an angular distribution of sputtered atoms such that a greater flux of sputtered X atoms occurs, as shown, in a direction normal to the sputtering surface 2S than at an acute angle to the sputtering surface 2S, whereas metal component Y exhibits an angular distribution of sputtered atoms such that a greater flux of sputtered Y atoms occurs at an acute angle to the sputtering surface 2S rather than normal thereto. Thus, in this instance, it is apparent that if the substrate deposition surface 1D is maintained in static position opposite the sputtering surface 2S during sputter deposition thereon, the resultant metal alloy film would be rich in metal component element X in the central region thereof, relative to metal component Y, whereas the reverse would obtain in the regions close to the substrate edges 1A and 1B. However, if, according to the inventive concept, the entire deposition surface 1D of the substrate 1 is moved past the entire width of the sputtering surface 2S (as measured from the first edge 2A to the second edge 2B of target 2) from the first edge 1A to the second edge 1B thereof, or in the opposite direction from the second edge 1B to the first edge 1A thereof, each areal portion of the deposition surface 1D traverses all of the arrival angles of the sputtered atoms X and Y, and thus each areal portion receives substantially the same flux of sputtered atoms, resulting in substantial compositional uniformity across the deposition surface 1D. While, in the illustrated example, the metal alloy is a binary alloy composed of only two elements X and Y, it should be apparent that the inventive concept is equally applicable to ternary, quaternary, 5-membered alloys, including, but not limited to magnetic and thermo-magnetic alloys utilized in the manufacture of magnetic and magneto-optical recording media, as well as to sputtering targets containing metallic and non-metallic elements.

Figure 4:
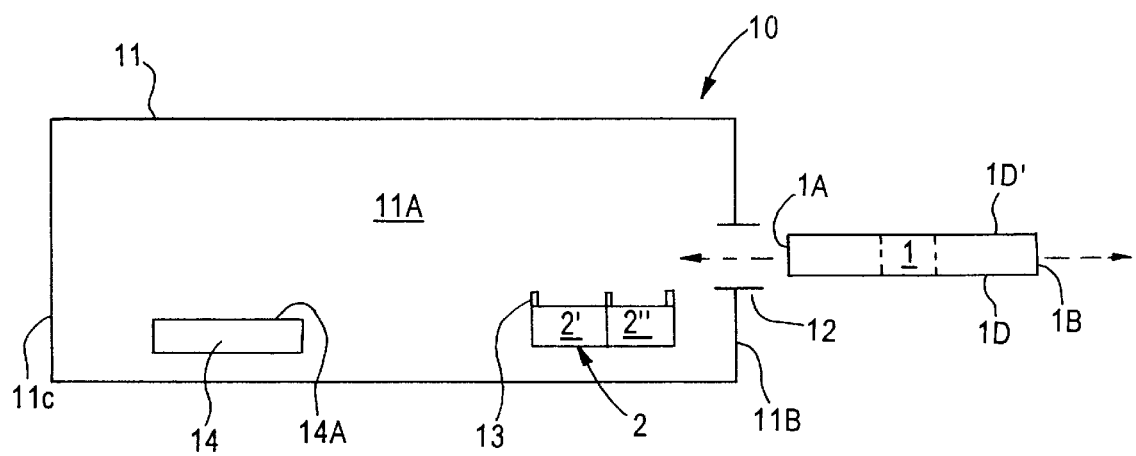
FIGS. 4 and 5, respectively, are schematic cross-sectional and plan views illustrating an embodiment of the present invention utilizable as part of a multi-station sputtering apparatus useful in the automated manufacture of magnetic and/or magneto-optical (MO) recording media.
Figure 5:
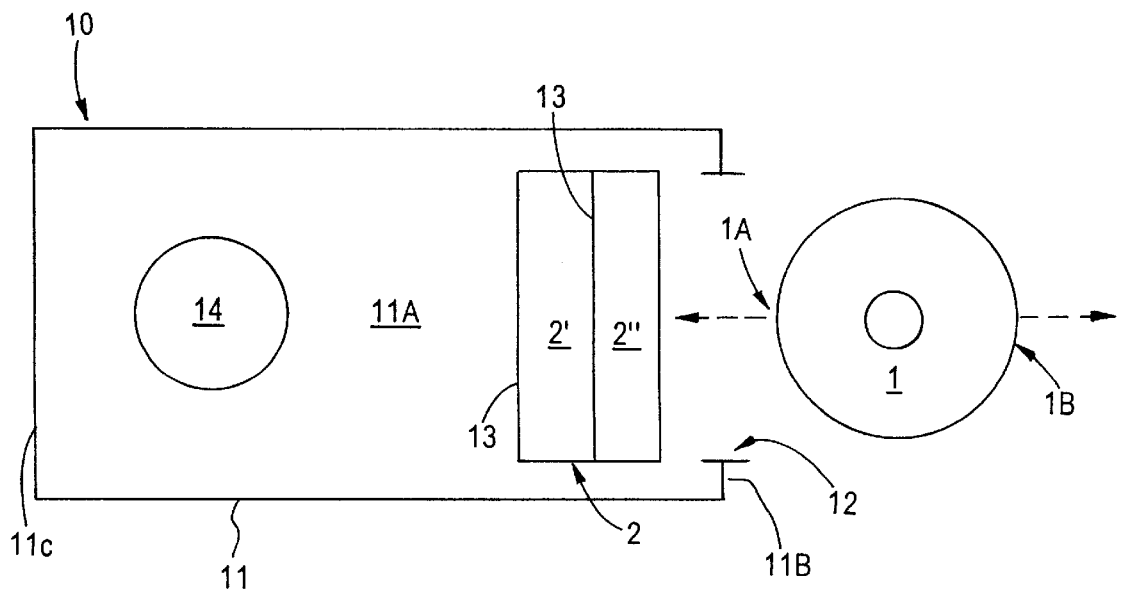

Referring now to FIGS. 4 and 5, shown therein are schematic, cross-sectional and plan views, respectively, illustrating an embodiment of a sputtering apparatus 10 embodying the inventive concept and methodology, which apparatus enjoys particular utility as part of a multi-station sputtering apparatus employed for automated manufacture of magnetic and MO recording media on, e.g., disk-shaped substrates. As illustrated, apparatus 10 comprises a process chamber 11 defining an interior space adapted to be maintained at a reduced pressure (by means not shown) and including an entrance/exit aperture 12 at a first end 11B thereof for insertion and withdrawal of a substrate for deposition thereon, e.g., a disk-shaped substrate 1, by suitable substrate mounting and moving means (not shown for illustrative simplicity). Process chamber 11 may form part of a multi-chamber apparatus utilized for serial deposition of a plurality of layers on a substrate, as in the manufacture of magnetic and/or magneto-optical recording media. Such multi-chamber apparatus may, for example, comprise a plurality of process chambers arranged in an in-line or radial fashion around a central hub, and include substrate (disk or wafer) holding and transport means as well as air locks, etc. for providing isolation between the various chambers, as needed. Inasmuch as such apparatus are conventional in the art, further details of their constitution are not provided here in order not to unnecessarily obscure the present invention.

Process chamber 11 is, according to an embodiment of the invention, further provided with an elongated, narrow first target 2 comprised of parallel, elongated, first and second target segments 2' and 2", respectively positioned immediately adjacent entrance/exit aperture 12, at least one of said target segments including a sputtering surface comprised of a metal alloy. A vapor shield 13 is provided so as to surround at least the periphery of the sputtering surfaces of the target segments in order to block sputtered atoms from arriving at the deposition surface 1D at very low angles. According to further embodiments of the invention, the vapor shield 13 is also provided between the first and second target segments 2', 2", the target segments are each of planar magnetron type, and sputtering power can be independently supplied to each segment.

According to yet another embodiment of the invention, a second target 14 having a sputtering surface 14A comprised of a material different from those of the first and second target segments 2', 2" of the first target 2 is positioned at a second end 11C of process chamber 11 remote from the first end 11B for static deposition of a layer of a different material over the layer(s) provided by the first and second target segments. According to a still further embodiment of the invention, another pair of first and second targets 2 and 14, respectively, is provided in facing relation thereto for performing similar sputter deposition on the second major deposition surface 1D' of disk-shaped substrate 1.

In typical operation, at least one alloy film is formed on at least one of the substrate deposition surfaces 1D and 1D' by sputtering from the first and/or second target segments 2', 2" only during insertion and/or removal of the substrate 1 from the process chamber via the entrance/exit aperture 12, and at least one different film is formed over the at least one alloy film by static sputtering of the at least one second target 14, when the substrate is statically positioned at the second end 11C of the process chamber 11 remote from the first end 11B after completion of the insertion process and/or before initiation of the removal process. Inasmuch as the sputtering and deposition behavior provided by the first and second target segments 2', 2" at the entrance/exit aperture 12 during substrate insertion and/or removal conforms in every respect with the inventive concept described with respect to FIG. 3, metal alloy films having excellent compositional uniformity across the substrate deposition surfaces 1D, 1D' are readily obtained.

A requirement of the inventive methodology is that the alloy deposition be conducted and completed during the insertion or removal phase, i.e., in a very short interval, e.g., <~0.5 sec. Consequently, the process gas flow to chamber 11 is increased during this time period in order to provide a higher pressure necessary for increased sputtering rates, and the power outputs of the power supplies for the first and second target segments 2', 2" are increased in order to provide a watt-sec. product which is substantially the same as that utilized with static deposition of metal alloy layers of same thickness.

Sputter deposition according to the inventive methodology provides a number of further advantages vis-a-vis static sputtering of metal alloys in addition to lateral compositional uniformity, including, inter alia, improved compositional uniformity in the vertical, i.e., depth, direction and increased film purity resulting from the shorter deposition time.

The use of a segmented first target, as described above, affords a number of additional advantages, including increased flexibility in choice of layer deposition sequences. For example, if each of the first target segments 2', 2" is comprised of different metal alloys, two distinct alloys may be deposited in sequence. Moreover, since each of the target segments is independently operable, a first metal alloy may be deposited from one of the target segments during substrate insertion and a second metal alloy may be deposited from the other one of the target segments during substrate removal, or one of the target segments may comprise a single metal or other, non-metallic material for performing a wide variety of multi-layer deposition sequences. The use of independently operated target segments also allows independent control of the thickness of each of the first and second metal alloy layers (or other type layers) by application of different sputtering power to each target segment. The inventive apparatus and methodology thus finds particular utility in the manufacture of magnetic recording media, for example, by facilitating deposition of a chromium (Cr) or ■chromium-vanadium (CrV) "seed" or underlayer just a fraction of a second before deposition of the overlying magnetic alloy layer, thus ensuring a clean interface between the two layers.

Thus, the present invention advantageously provides a method and apparatus for sputter deposition of metal alloy layers with increased compositional uniformity across the width of a substrate surface. The inventive methodology can be readily and cost-effectively implemented by modification of conventional single or multi-station sputtering apparatus and affords a number of other significant advantages vis-a- vis conventional static sputtering of metal alloy layers, including, inter alia, increased vertical composition uniformity, higher purity deposition, and increased flexibility of layer deposition. Further, the inventive methodology and apparatus are not limited to the manufacture of magnetic and/or magneto-optical recording media. rather, the invention is broadly applicable to the sputtering of metal alloys and layer stacks comprising metal alloys for use in various applications and devices, e.g., protective and reflective coatings, architectural glass, etc.

In the previous description, numerous specific details are set forth, such as specific materials, structures, reactants, processes, etc., in order to provide a better understanding of the present invention. however, the present invention can be practiced without resorting to the details specifically set forth. In other instances, well-known processing techniques and structures have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes and/or modifications within the scope of the inventive concept as expressed herein.

What is claimed is:

1. A method of sputter depositing a layer of a substantially uniform composition metal alloy on a deposition surface of a substrate, which method comprises the sequential steps of:
   (a) providing a first target including a planar sputtering surface having a first width and comprised of at least a first metal alloy including at least two metal component elements, each element providing different angular distributions of sputtered atoms;
   (b) providing a substrate having a planar deposition surface for receiving said sputtered atoms for deposition thereon of a layer of said first metal alloy, said deposition surface including opposed first and second edges defining a second width which is at least twice that of said first width of said sputtering surface; and
   (c) sputtering said first target while moving said deposition surface past said sputtering surface from said first edge thereof to said second edge thereof, and/or from said second edge thereof to said first edge thereof, to deposit said layer of first metal alloy thereon, whereby said deposition surface traverses all arrival angles of said sputtered atoms during its motion past said sputtering surface, thereby compensating for said different angular distributions of said sputtered atoms and substantially eliminating non-uniform deposition of said metal component elements of said first metal alloy; wherein:
   step (a) further comprises providing said first target within a process chamber, said first target being located immediately adjacent an entrance/exit aperture thereof for inserting and withdrawing said substrate from said process chamber;
   step (b) further comprises inserting said substrate into said process chamber via said entrance/exit aperture; and
   step (c) comprises sputtering at least a first portion of said sputtering surface of said first target to deposit a layer of said first metal alloy on said substrate surface during said inserting of said substrate into said process chamber.

2. The method according to claim 1, wherein:
   step (a) further comprises providing a vapor shield surrounding the periphery of said sputtering surface of said first target for blocking deposition of sputtered atoms having very low arrival angles at said substrate deposition surface.

3. The method according to claim 1, wherein:
   said first metal alloy comprising said sputtering surface of said first target is a magnetic or non-magnetic alloy utilized in the manufacture of magnetic or magneto-optical (MO) recording media.

4. The method according to claim 3, wherein:
   step (a) comprises providing a first target having an elongated sputtering surface, wherein said first width thereof corresponds to the narrow dimension of said elongated sputtering surface;
   step (b) comprises providing a disk-shaped substrate for a magnetic or MO recording medium having first and second opposed major deposition surfaces, wherein said second width thereof corresponds to an outer diameter of said disk-shaped substrate; and
   step (c) comprises depositing said layer of first metal alloy on said first major deposition surface.

5. The method according to claim 4, wherein:
   step (a) further comprises providing another target substantially identical to said first target, such that the sputtering surface thereof faces said second major deposition surface; and
   step (c) comprises depositing a layer of said first metal alloy on said second major deposition surface.

6. The method according to claim 1, comprising the further steps of:
   (d) terminating said moving of said substrate deposition surface past said sputtering surface of said first target after completion of step (c); and
   (e) sputtering a second target located within said process chamber and comprised of a second target material for static deposition of a layer of said second target material on said first metal alloy layer.

7. The method according to claim 6, comprising the further steps of:
   (f) removing said substrate from said process chamber via said entrance/exit aperture after completion of step (e); and
   (g) sputtering at least a second portion of said sputtering surface of said first target during said removing of said substrate from said process chamber.

8. The method according to claim 7, wherein:
   step (a) further comprises providing said first target having an elongated sputtering surface in the form of parallel, elongated, first and second planar magnetron target segments which together constitute said first width, wherein the sputtering surface of at least one of said first and second planar magnetron target segments comprises a metal alloy.

9. The method according to claim 8, wherein:
   a vapor shield is provided intermediate said first and second target segments to separate atoms sputtered from each target segment; and
   said first and second target segments are electrically isolated from each other and sputtering power is independently applied to each segment.

10. An apparatus for sputter deposition of a substantially uniform composition metal alloy film on a substrate deposition surface, comprising:
   (a) a process chamber defining an interior space and including a substrate entrance/exit aperture at one end thereof for inserting and withdrawing a said substrate from said process chamber;

(b) a first target means positioned within said interior space immediately adjacent said entrance/exit aperture, said first target means including a planar sputtering surface having a first width and comprised of at least a first metal alloy including at least two metal component elements, each of said metal component elements having different angular distributions of sputtered atoms; and (c) substrate mounting and moving means for inserting and withdrawing a substrate from said process chamber via said entrance/exit aperture, said mounting and moving means being adapted to provide a substrate having a planar deposition surface which moves past said sputtering surface for receiving sputtered atoms therefrom for deposition thereon of a layer of said first metal alloy during said inserting and/or withdrawing via said entrance/exit aperture, said substrate deposition surface including opposed first and second edges defining a second width which is substantially greater than said first width of said sputtering surface, whereby said substrate deposition surface during its motion past the sputtering surface during said inserting and/or withdrawing via said entrance/exit aperture traverses all arrival angles of said sputtered atoms of said metal component elements, thereby substantially eliminating non-uniform deposition of said metal component elements on said substrate deposition surface due to said different angular distributions of sputtered atoms.

11. An apparatus as in claim 10, wherein:

said first target means (b) further comprises a vapor shield surrounding the periphery of said sputtering surface thereof for blocking deposition of sputtered atoms having very low arrival angles at said substrate deposition surface.

12. An apparatus as in claim 10, wherein:

said substrate mounting and moving means (c) is adapted to provide a substrate having a second width which is at least twice that of said first width of said sputtering surface of said first target means.

13. An apparatus as in claim 12, wherein:

said first target means (b) comprises an elongated, planar, sputtering surface and said first width thereof corresponds to the narrow dimension of said elongated sputtering surface; and said substrate mounting and moving means (c) is adapted to provide a disk-shaped substrate having opposed first and second major deposition surfaces, and said second width of said substrate deposition surfaces corresponds to an outer diameter of said substrate.

14. An apparatus as in claim 13, further comprising:

an additional target means substantially identical to said first target means (b) for depositing a layer of first metal alloy on both of said first and second major deposition surfaces of said disk-shaped substrate.

15. An apparatus as in claim 13, wherein:

said first target means (b) comprises a planar sputtering surface including parallel, elongated, first and second planar magnetron target segments which together constitute said first width thereof, wherein the sputtering surface of at least one of said first and second planar magnetron target segments comprises a metal alloy.

16. An apparatus as in claim 15, wherein:

said first target means (b) further comprises a vapor shield provided intermediate said first and second target segments to separate atoms sputtered from each target segment.

17. An apparatus as in claim 15, wherein:

said first target means (b) further comprises means for electrically isolating said first and second target segments from each other; said apparatus further comprising means for independently applying sputtering power to each target segment.

18. An apparatus as in claim 10, further comprising:

(d) a second target means within said interior space of said process chamber and comprised of a second target material, for static sputter deposition of a layer of said second target material on said first metal alloy layer.

19. Apparatus for sputter deposition of a substantially uniform composition metal alloy layer on a planar deposition surface of a substrate, comprising:

a process chamber including therein a first, relatively narrow sputtering target located immediately adjacent an entrance/exit aperture thereof utilized for inserting and withdrawing a said substrate therefrom and a second, relatively wider sputtering target spaced from said first sputtering target, said first sputtering target having a planar sputtering surface composed of a first target material comprised of a metal alloy including at least two metal elements each having different angular distributions of sputtered atoms; and means for compensating for said different angular distributions of sputtered atoms from said first sputtering target to thereby form a substantially uniform composition metal alloy layer on said substrate deposition surface.

20. An apparatus as in claim 19, wherein:

said second sputtering target is comprised of a second target material for sputter deposition of a layer of said second target material on said metal alloy layer.

* * * * *

UNITED STATES PATENT AND TRADEMARK OFFICE
CERTIFICATE OF CORRECTION

PATENT NO.     : 6,309,516 B1
DATED          : October 30, 2001
INVENTOR(S)    : Paul Stephen McLeod It is certified that error appears in the above-identified patent and that said Letters Patent is hereby corrected as shown below:

<u>Title page,</u>
Item [54], Title, change "ALLOT" to -- ALLOY --

Signed and Sealed this

Twentieth Day of July, 2004

JON W. DUDAS
*Acting Director of the United States Patent and Trademark Office*